United States Patent
Huang

(10) Patent No.: US 12,044,942 B2
(45) Date of Patent: Jul. 23, 2024

(54) ARRAY SUBSTRATE AND LIQUID CRYSTAL DISPLAY PANEL WITH MAIN AN SUB-PIXEL ELECTRODES CONFIGURED FOR LIQUID CRYSTAL ALIGNMNET WITHIN WIDE AND NARROW VIEWING ANGLES

(71) Applicant: Huizhou China Star Optoelectronics Display Co., Ltd., Guangdong (CN)

(72) Inventor: Dongchen Huang, Guangdong (CN)

(73) Assignee: Huizhou China Star Optoelectronics Display Co., Ltd., Guangdong (CN)

( * ) Notice: Subject to any disclaimer, the term of this patent is extended or adjusted under 35 U.S.C. 154(b) by 359 days.

(21) Appl. No.: 17/425,962

(22) PCT Filed: Jun. 24, 2021

(86) PCT No.: PCT/CN2021/101979
§ 371 (c)(1),
(2) Date: Jul. 27, 2021

(87) PCT Pub. No.: WO2022/151660
PCT Pub. Date: Jul. 21, 2022

(65) Prior Publication Data
US 2023/0367162 A1 Nov. 16, 2023

(30) Foreign Application Priority Data

Jan. 13, 2021 (CN) .......................... 202110039786.8

(51) Int. Cl.
*G02F 1/1362* (2006.01)
*G02F 1/13* (2006.01)
*H01L 27/12* (2006.01)

(52) U.S. Cl.
CPC ...... *G02F 1/136286* (2013.01); *G02F 1/1323* (2013.01); *H01L 27/124* (2013.01)

(58) Field of Classification Search
CPC . G02F 1/136286; G02F 1/1323; H01L 27/124
See application file for complete search history.

(56) References Cited

U.S. PATENT DOCUMENTS

2012/0281174 A1* 11/2012 Yeh .......................... G02F 1/133
349/129
2013/0057818 A1   3/2013 Cho et al.
(Continued)

FOREIGN PATENT DOCUMENTS

CN    102213869    10/2011
CN    102707528    10/2012
(Continued)

*Primary Examiner* — Tracie Y Green
(74) *Attorney, Agent, or Firm* — PV IP PC; Wei Te Chung; Zhigang Ma

(57) ABSTRACT

An array substrate and a liquid crystal display panel are provided. In the array substrate, a main pixel electrode includes a first vertical portion, a first horizontal portion, a plurality of first branch electrodes, and a plurality of second branch electrodes. An included angle between an extending direction of the first branch electrodes and an extending direction of the first vertical portion is a first included angle. And, a first sub-pixel electrode includes a second vertical portion and a plurality of first sub-electrodes. An included angle between an extending direction of the first sub-electrodes and an extending direction of the second vertical portion is a second included angle. The first included angle is less than the second included angle.

20 Claims, 4 Drawing Sheets

(56) References Cited

U.S. PATENT DOCUMENTS

| | | | |
|---|---|---|---|
| 2013/0265514 A1 | 10/2013 | Li et al. | |
| 2013/0314640 A1 | 11/2013 | Kang | |
| 2020/0302887 A1* | 9/2020 | Chen | G02F 1/13624 |
| 2021/0223647 A1* | 7/2021 | Wang | G02F 1/136286 |

FOREIGN PATENT DOCUMENTS

| | | |
|---|---|---|
| CN | 104267548 | 1/2015 |
| CN | 105572927 | 5/2016 |
| CN | 108490696 | 9/2018 |
| CN | 109100881 | 12/2018 |
| CN | 109725448 | 5/2019 |
| CN | 111474779 | 7/2020 |
| CN | 112068340 | 12/2020 |
| CN | 112859395 | 5/2021 |
| KR | 10-2010-0046826 | 5/2010 |
| TW | 200825593 | 6/2008 |

* cited by examiner

ARRAY SUBSTRATE AND LIQUID CRYSTAL DISPLAY PANEL WITH MAIN AN SUB-PIXEL ELECTRODES CONFIGURED FOR LIQUID CRYSTAL ALIGNMNET WITHIN WIDE AND NARROW VIEWING ANGLES

RELATED APPLICATIONS

This application is a National Phase of PCT Patent Application No. PCT/CN2021/101979 having International filing date of Jun. 24, 2021, which claims the benefit of priority of Chinese Patent Application No. 202110039786.8 filed on Jan. 13, 2021. The contents of the above applications are all incorporated by reference as if fully set forth herein in their entirety.

FIELD AND BACKGROUND OF THE INVENTION

The present disclosure relates to the technical field of display, and particularly to an array substrate and a liquid crystal display panel.

In research and practice of the prior art, the inventors of the present application find that a current display panel with an anti-peeping function is generally formed by stacking an independent anti-peeping structure and a display panel. Such an external hanging structure is more complicated in structure and thicker.

SUMMARY OF THE INVENTION

The present disclosure provides an array substrate and a liquid crystal display panel, which can simplify and thin a panel with an anti-peeping function.

The present disclosure provides an array substrate comprising:
  a base substrate;
  a plurality of first gate lines disposed on the base substrate;
  a plurality of second gate lines disposed on the base substrate and spaced apart from the first gate lines;
  a plurality of data lines disposed on the base substrate, wherein the data lines cross the first gate lines to form a plurality of pixel areas; and
  a plurality of pixel electrodes disposed on the base substrate, wherein each of the pixel electrodes is disposed in a corresponding pixel area and comprises a main pixel electrode and a first sub-pixel electrode that are disposed independently, the first sub-pixel electrode is disposed on a side of the main pixel electrode, the main pixel electrode is electrically connected to a corresponding first gate line, the first sub-pixel electrode is electrically connected to a corresponding second gate line, and an alignment angle of liquid crystals on the main pixel electrode is less than an alignment angle of liquid crystals on the first sub-pixel electrode.

In an embodiment, the main pixel electrode comprises a first vertical portion, a first horizontal portion, a plurality of first branch electrodes, and a plurality of second branch electrodes. An extending direction of the first vertical portion is perpendicular to an extending direction of the first gate lines. The first horizontal portion intersects with the first vertical portion. The first horizontal portion and the first vertical portion divide the main pixel electrode into at least a first region and a second region. The first branch electrodes are disposed in the first region and parallel to each other. At least part of the first branch electrodes obliquely extends outward from the first vertical portion. An included angle between an extending direction of the first branch electrodes and the extending direction of the first vertical portion is a first included angle. The second branch electrodes are disposed in the second region. A top view pattern of the second branch electrodes and a top view pattern of the first branch electrodes are symmetrically disposed with respect to an extension line of the first vertical portion. The first sub-pixel electrode comprises a second vertical portion and a plurality of first sub-electrodes. An extending direction of the second vertical portion is perpendicular to the extending direction of the first gate lines. At least part of the first sub-electrodes obliquely extends outward from the second vertical portion. An included angle between an extending direction of the first sub-electrodes and the extending direction of the second vertical portion is a second included angle. The first included angle is less than the second included angle.

In an embodiment, the first sub-pixel electrode further comprises only one alignment region, and the first sub-electrodes are disposed in the alignment region.

In an embodiment, the first sub-pixel electrode further comprises another second vertical portion and two second horizontal portions. The two second vertical portions are disposed opposite to each other. The first sub-electrodes are connected between the two second vertical portions. The two second horizontal portions extend in a direction parallel to the first gate lines and are disposed opposite to each other. The second horizontal portions and the second vertical portions are connected end to end to form a frame.

In an embodiment, the first sub-pixel electrode further comprises a first alignment region and a second alignment region that are adjacently disposed and further comprises a plurality of second sub-electrodes. The first sub-electrodes are disposed in the first alignment region, and the second sub-electrodes are disposed in the second alignment region. At least part of the second sub-electrodes obliquely extends outward from the second vertical portion, and an extending direction of the second sub-electrodes is different from an extending direction of the first sub-electrodes.

In an embodiment, the first sub-pixel electrode further comprises a second horizontal portion extending in a direction parallel to the first gate lines and connected to the second vertical portion. The second horizontal portion and the second vertical portion define the first alignment region and the second alignment region. An included angle between the extending direction of the first sub-electrodes and the extending direction of the second vertical portion is equal to an included angle between the extending direction of the second sub-electrodes and the extending direction of the second vertical portion.

In an embodiment, the first included angle is greater than 0 degrees and less than or equal to 15 degrees, and the second included angle is greater than or equal to 75 degrees and less than 90 degrees.

In an embodiment, each of the pixel electrodes further comprises a second sub-pixel electrode disposed on another side of the main pixel electrode, disposed independently of the main pixel electrode, and electrically connected to the corresponding second gate line. A top view pattern of the first sub-pixel electrode and a top view pattern of the second sub-pixel electrode are symmetrically disposed with respect to an extension line of the first vertical portion.

In an embodiment, a part of the first branch electrodes is connected to the first horizontal portion, and the other part of the first branch electrodes is connected to the first vertical portion. A part of the second branch electrodes is connected to the first horizontal portion, and the other part of the second branch electrodes is connected to the first vertical portion.

In an embodiment, the first horizontal portion and the first vertical portion further divide the main pixel electrode into a third region and a fourth region. The main pixel electrode further comprises a plurality of third branch electrodes and a plurality of fourth branch electrodes. The third branch electrodes are disposed in the third region. A top view pattern of the third branch electrodes and the top view pattern of the first branch electrodes are symmetrically disposed with respect to an extension line of the first horizontal portion. The fourth branch electrodes are disposed in the fourth region. A top view pattern of the fourth branch electrodes and the top view pattern of the second branch electrodes are symmetrically disposed with respect to the extension line of the first horizontal portion.

The present disclosure further provides a liquid crystal display panel comprising a color filter substrate, a liquid crystal layer, and the array substrate as described in the above embodiments. The array substrate comprises:

a plurality of first gate lines;
a plurality of second gate lines spaced apart from the first gate lines;
a plurality of data lines, wherein the data lines cross the first gate lines to form a plurality of pixel areas; and
a plurality of pixel electrodes, wherein each of the pixel electrodes is disposed in a corresponding pixel area and comprises a main pixel electrode and a first sub-pixel electrode that are disposed independently, the first sub-pixel electrode is disposed on a side of the main pixel electrode, the main pixel electrode is electrically connected to a corresponding first gate line, the first sub-pixel electrode is electrically connected to a corresponding second gate line, and an alignment angle of liquid crystals on the main pixel electrode is less than an alignment angle of liquid crystals on the first sub-pixel electrode.

In an embodiment, the main pixel electrode comprises a first vertical portion, a first horizontal portion, a plurality of first branch electrodes, and a plurality of second branch electrodes. An extending direction of the first vertical portion is perpendicular to an extending direction of the first gate lines. The first horizontal portion intersects with the first vertical portion. The first horizontal portion and the first vertical portion divide the main pixel electrode into at least a first region and a second region. The first branch electrodes are disposed in the first region and parallel to each other. At least part of the first branch electrodes obliquely extends outward from the first vertical portion. An included angle between an extending direction of the first branch electrodes and the extending direction of the first vertical portion is a first included angle. The second branch electrodes are disposed in the second region. A top view pattern of the second branch electrodes and a top view pattern of the first branch electrodes are symmetrically disposed with respect to an extension line of the first vertical portion. The first sub-pixel electrode comprises a second vertical portion and a plurality of first sub-electrodes. An extending direction of the second vertical portion is perpendicular to the extending direction of the first gate lines. At least part of the first sub-electrodes obliquely extends outward from the second vertical portion. An included angle between an extending direction of the first sub-electrodes and the extending direction of the second vertical portion is a second included angle. The first included angle is less than the second included angle.

In an embodiment, the first sub-pixel electrode further comprises only one alignment region, and the first sub-electrodes are disposed in the alignment region.

In an embodiment, the first sub-pixel electrode further comprises another second vertical portion and two second horizontal portions. The two second vertical portions are disposed opposite to each other. The first sub-electrodes are connected between the two second vertical portions. The two second horizontal portions extend in a direction parallel to the first gate lines and are disposed opposite to each other. The second horizontal portions and the second vertical portions are connected end to end to form a frame.

In an embodiment, the first sub-pixel electrode further comprises a first alignment region and a second alignment region that are adjacently disposed and further comprises a plurality of second sub-electrodes. The first sub-electrodes are disposed in the first alignment region, and the second sub-electrodes are disposed in the second alignment region. At least part of the second sub-electrodes obliquely extends outward from the second vertical portion, and an extending direction of the second sub-electrodes is different from an extending direction of the first sub-electrodes.

In an embodiment, the first sub-pixel electrode further comprises a second horizontal portion extending in a direction parallel to the first gate lines and connected to the second vertical portion. The second horizontal portion and the second vertical portion define the first alignment region and the second alignment region. An included angle between the extending direction of the first sub-electrodes and the extending direction of the second vertical portion is equal to an included angle between the extending direction of the second sub-electrodes and the extending direction of the second vertical portion.

In an embodiment, the first included angle is greater than 0 degrees and less than or equal to 15 degrees, and the second included angle is greater than or equal to 75 degrees and less than 90 degrees.

In an embodiment, each of the pixel electrodes further comprises a second sub-pixel electrode disposed on another side of the main pixel electrode, disposed independently of the main pixel electrode, and electrically connected to the corresponding second gate line. A top view pattern of the first sub-pixel electrode and a top view pattern of the second sub-pixel electrode are symmetrically disposed with respect to an extension line of the first vertical portion.

In an embodiment, a part of the first branch electrodes is connected to the first horizontal portion, and the other part of the first branch electrodes is connected to the first vertical portion. A part of the second branch electrodes is connected to the first horizontal portion, and the other part of the second branch electrodes is connected to the first vertical portion.

In an embodiment, the first horizontal portion and the first vertical portion further divide the main pixel electrode into a third region and a fourth region. The main pixel electrode further comprises a plurality of third branch electrodes and a plurality of fourth branch electrodes. The third branch electrodes are disposed in the third region. A top view pattern of the third branch electrodes and the top view pattern of the first branch electrodes are symmetrically disposed with respect to an extension line of the first horizontal portion. The fourth branch electrodes are disposed in the fourth region. A top view pattern of the fourth branch electrodes and the top view pattern of the second branch electrodes are symmetrically disposed with respect to the extension line of the first horizontal portion.

In the embodiments of the disclosure, the sub-pixel electrode(s) is/are disposed on one or two sides of the main pixel electrode. The main pixel electrode is configured for liquid crystal alignment within a narrow viewing angle, and the sub-pixel electrode is configured for liquid crystal alignment within a wide viewing angle. Specifically, when the display panel is in an anti-peeping state, the main pixel electrode is turned on, and the sub-pixel electrode is turned off. When the display panel is in a shared state, the main pixel electrode and the sub-pixel electrode are simultaneously turned on. The above arrangement simplifies an anti-peeping structure.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

The present disclosure provides an array substrate and a liquid crystal display panel, which will be described in detail below. It should be noted that a description order of the following embodiments is not intended to limit a preferred order of the embodiments.

Figure 1:
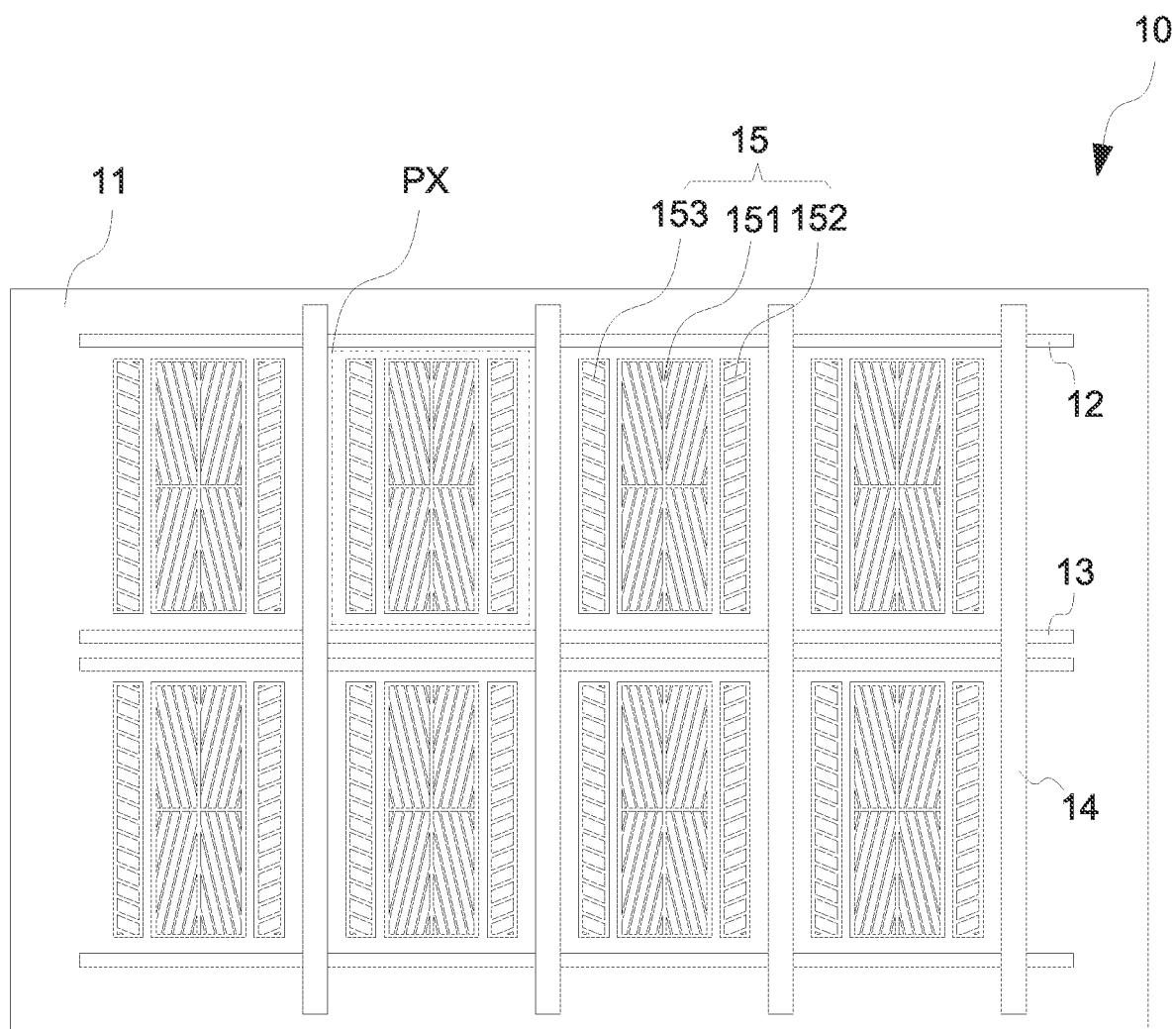
FIG. 1 is a schematic top view of an array substrate according to an embodiment of the present disclosure.

Please refer to FIG. 1, which is a schematic top view of an array substrate according to an embodiment of the present disclosure. The present disclosure provides an array substrate 10 comprising a base substrate 11, a plurality of first gate lines 12, a plurality of second gate lines 13, a plurality of data lines 14, and a plurality of pixel electrodes 15.

The first gate lines 12 and the second gate lines 13 are disposed on the base substrate 11 and are spaced apart from each other. An extending direction of the first gate lines 12 is parallel to an extending direction of the second gate lines 13. The data lines 14 are disposed on the first gate lines 12 and are disposed in a different layer from the first gate lines 12. The data lines 14 cross the first gate lines 12 to form a plurality of pixel areas PX. Each of the pixel electrodes 15 is disposed on the base substrate 11 and is disposed in a corresponding pixel area PX.

Each of the pixel electrodes 15 comprises a main pixel electrode 151, a first sub-pixel electrode 152, and a second sub-pixel electrode 153. The main pixel electrode 151 and the first sub-pixel electrode 152 are disposed independently of each other. The main pixel electrode 151 and the second sub-pixel electrode 153 are also disposed independently of each other.

The first sub-pixel electrode 152 is disposed on a side of the main pixel electrode 151, and the second sub-pixel electrode 153 is disposed on an opposite side of the main pixel electrode 151. The main pixel electrode 151 is electrically connected to a corresponding first gate line 12. The first sub-pixel electrode 152 and the second sub-pixel electrode 153 are electrically connected to a corresponding second gate line 13.

Specifically, the main pixel electrodes 151 in a same row are electrically connected to a same corresponding first gate line 12. The first sub-pixel electrodes 152 and the second sub-pixel electrodes 153 in a same row are electrically connected to a same corresponding second gate line 13.

An alignment angle of liquid crystals on the main pixel electrode 151 is less than an alignment angle of liquid crystals on the first sub-pixel electrode 152 and the second sub-pixel electrode 153.

In other words, in the array substrate 10 of the present disclosure, the main pixel electrode 151 is configured for liquid crystal alignment within a narrow viewing angle, and the first sub-pixel electrode 152 and the second sub-pixel electrode 153 are configured for liquid crystal alignment within a wide viewing angle. Specifically, when a display panel is in an anti-peeping state, in the array substrate 10 of the present disclosure, the main pixel electrode 151 is turned on, and the first sub-pixel electrode 152 and the second sub-pixel electrode 153 are turned off. When the display panel is in a shared state, in the array substrate 10 of the present disclosure, the main pixel electrode 151, the first sub-pixel electrode 152, and the second sub-pixel electrode 153 are simultaneously turned on. The above arrangement simplifies a structure.

In some embodiments, in the array substrate 10, the main pixel electrode 151 may also be provided with only one sub-pixel electrode to switch between a narrow viewing angle and a wide viewing angle.

Figure 2:
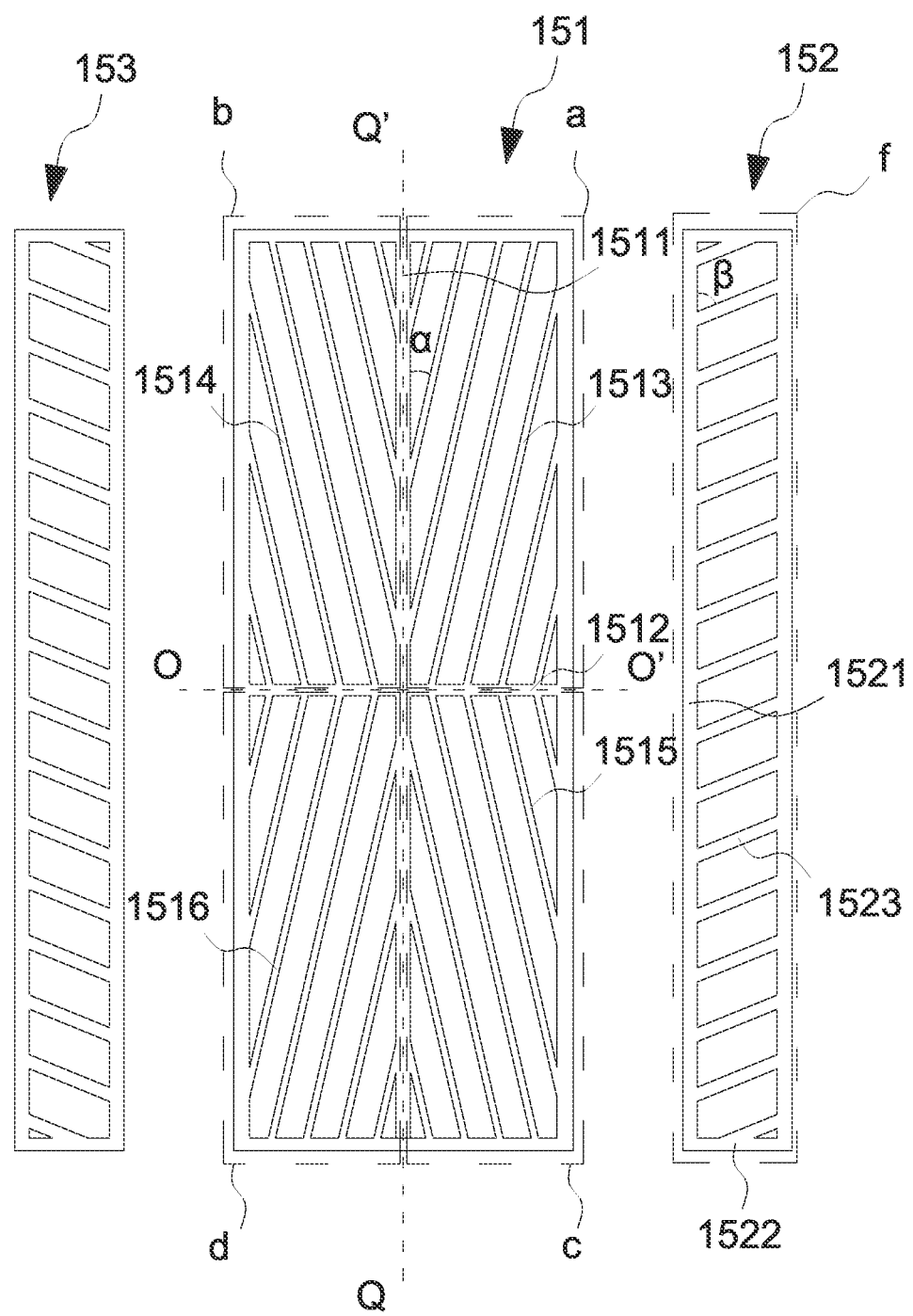
FIG. 2 is a schematic structural diagram of a pixel electrode of the array substrate according to an embodiment of the present disclosure.

Specifically, please refer to FIG. 2, the main pixel electrode 151 comprises a first vertical portion 1511, a first horizontal portion 1512, a plurality of first branch electrodes 1513, a plurality of second branch electrodes 1514, a plurality of third branch electrodes 1515, and a plurality of fourth branch electrodes 1516. The first horizontal portion 1512 and the first vertical portion 1511 divide the main pixel electrode 151 into a first region a, a second region b, a third region c, and a fourth region d.

Alternatively, in some embodiments, the first horizontal portion 1512 and the first vertical portion 1511 may also divide the main pixel electrode 151 into a first region a and a second region b. That is, the main pixel electrode 151 is a pixel electrode having at least two domains.

In the array substrate 10 of this embodiment, the first branch electrodes 1513 are disposed in the first region a, the second branch electrodes 1514 are disposed in the second region b, the third branch electrodes 1515 are disposed in the third region c, and the fourth branch electrodes 1516 are disposed in the fourth region d.

The first branch electrodes 1513 are disposed parallel to each other. The second branch electrodes 1514 are disposed parallel to each other. The third branch electrodes 1515 are disposed parallel to each other. The fourth branch electrodes 1516 are disposed parallel to each other.

At least part of the first branch electrodes 1513 obliquely extends outward from the first vertical portion 1511. At least part of the second branch electrodes 1514 obliquely extends outward from the first vertical portion 1511. An extending direction of the first vertical portion 1511 is perpendicular to the extending direction of the first gate lines 12. The first horizontal portion 1512 and the first vertical portion 1511 are intersected.

Specifically, a part of the first branch electrodes 1513 is connected to the first horizontal portion 1512, and the other part of the first branch electrodes 1513 is connected to the first vertical portion 1511. A part of the second branch electrodes 1514 is connected to the first horizontal portion 1512, and the other part of the second branch electrodes 1514 is connected to the first vertical portion 1511.

A top view pattern of the second branch electrodes 1514 and a top view pattern of the first branch electrodes 1513 are symmetrically disposed with respect to an extension line QQ' of the first vertical portion 1511. A top view pattern of the third branch electrodes 1515 and the top view pattern of the first branch electrodes 1513 are symmetrically disposed with respect to an extension line OO' of the first horizontal portion 1512. A top view pattern of the fourth branch electrodes 1516 and the top view pattern of the second branch electrodes 1514 are symmetrically disposed with respect to the extension line OO' of the first horizontal portion 1512.

An included angle between an extending direction of the first branch electrodes 1513 and the extending direction of the first vertical portion 1511 is a first included angle $\alpha$.

In the array substrate 10 of this embodiment, the first sub-pixel electrode 152 comprises two second vertical portions 1521, two second horizontal portions 1522, and a plurality of first sub-electrodes 1523. An extending direction of the second vertical portions 1521 is perpendicular to the extending direction of the first gate lines 12. The second horizontal portions 1522 extend in a direction parallel to the first gate lines 12. That is, an extending direction of the second horizontal portions 1522 is parallel to the extending direction of the first gate lines 12.

The first sub-pixel electrode 152 further comprises only one alignment region f. The first sub-electrodes 1523 are disposed in the alignment region f. At least part of the first sub-electrodes 123 obliquely extends outward from the second vertical portions 1521.

Specifically, the two second horizontal portions 1522 are disposed opposite to each other. The two second vertical portions 1521 are also disposed opposite to each other. The second horizontal portions 1522 and the second vertical portions 1521 are connected end to end to form a frame. The first sub-electrodes 1523 are connected between the two second vertical portions 5121.

An included angle between an extending direction of the first sub-electrodes 1523 and the extending direction of the second vertical portion 1521 is a second included angle $\beta$.

The first included angle $\alpha$ is less than the second included angle $\beta$. Optionally, the first included angle $\alpha$ is greater than 0 degrees and less than or equal to 15 degrees. The second included angle $\beta$ is greater than or equal to 75 degrees and less than 90 degrees.

In this embodiment, the first included angle $\alpha$ is limited to be less than or equal to 15 degrees to improve an anti-peeping effect; the second included angle $\beta$ is limited to be greater than or equal to 75 degrees to increase a horizontal viewing angle, thereby improving a sharing effect.

Optionally, the first included angle $\alpha$ may be 5 degrees, 10 degrees, or 15 degrees. The second included angle $\beta$ may be 75 degrees or 80 degrees.

In the array substrate 10 of this embodiment, a top-view pattern of the first sub-pixel electrode 152 and a top-view pattern of the second sub-pixel electrode 153 are symmetrically disposed with respect to the extension line QQ' of the first vertical portion 1511. This arrangement is conducive to achieving symmetry of a viewing angle.

In some embodiments, an included angle between an extending direction of one of the first sub-electrodes 1523 and the extending direction of the second vertical portion 1521 is different from an included angle between an extending direction of adjacent one of the first sub-electrodes 1523 and the extending direction of the second vertical portion 1521, thereby improving the viewing angle.

In some embodiments, the top-view pattern of the first sub-pixel electrode 152 and the top-view pattern of the second sub-pixel electrode 153 may also be disposed asymmetrically.

Figure 3:
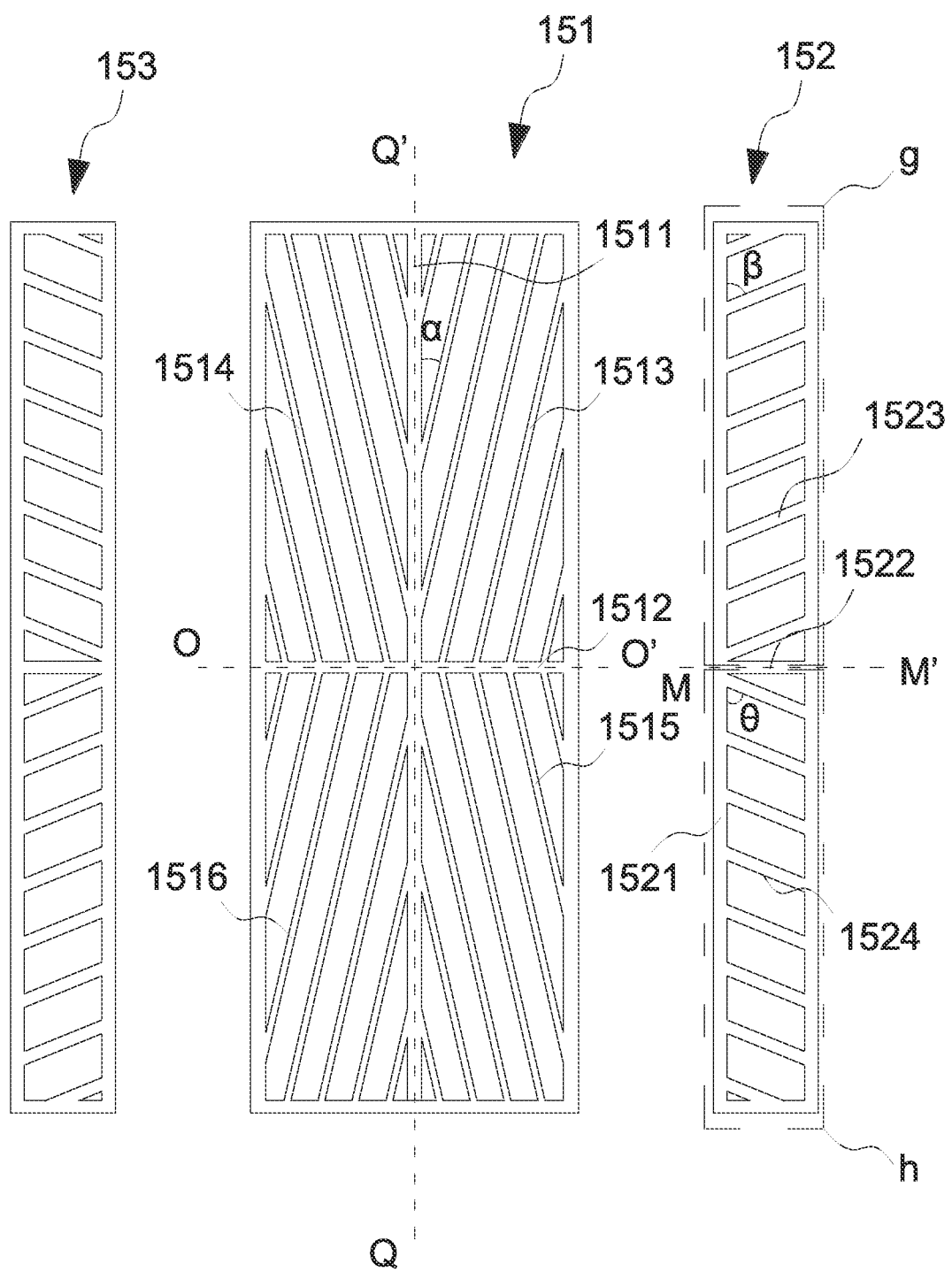
FIG. 3 is another schematic structural diagram of the pixel electrode of the array substrate according to an embodiment of the present disclosure.

In some embodiments, please refer to FIG. 3, the first sub-pixel electrode 152 comprises a first alignment region g and a second alignment region h that are adjacently disposed. The first sub-pixel electrode 152 further comprises two second vertical portions 1521, a second horizontal portion 1522, a plurality of first sub-electrodes 1523, and a plurality of second sub-electrodes 1524. An extending direction of the second vertical portions 1521 is perpendicular to the extending direction of the first gate lines 12. The second horizontal portion 1522 extends in a direction parallel to the first gate lines 12. That is, an extending direction of the second horizontal portion 1522 is parallel to the extending direction of the first gate lines 12.

At least part of the second sub-electrodes 1524 obliquely extends outward from the second vertical portions 1521. The first sub-electrodes 1523 are disposed in the first alignment region g. The second sub-electrodes 1524 are disposed in the second alignment region h.

An extending direction of the second sub-electrodes 1524 is different from an extending direction of the first sub-electrodes 1523, so as to produce different liquid crystal alignments of the first sub-pixel electrode 152, thereby increasing the viewing angle.

Specifically, the first sub-electrodes 1523 are disposed parallel to each other. The second sub-electrodes 1524 are also disposed parallel to each other. The second horizontal portion 1522 is connected to the second vertical portions 1521. The second horizontal portion 1522 and the second vertical portions 1521 define the first alignment region g and the second alignment region h.

The second included angle $\beta$ between the extending direction of the first sub-electrodes 1523 and the extending direction of the second vertical portions 1521 is equal to an included angle $\theta$ between the extending direction of the second sub-electrodes 1524 and the extending direction of the second vertical portions 1521.

Optionally, a top view pattern of the first sub-electrodes 1523 and a top view pattern of the second sub-electrodes 1524 are symmetrically disposed with respect to an extension line MM' of the second horizontal portion 1522.

A top view pattern of the first sub-pixel electrode 152 and a top view pattern of the second sub-pixel electrode 153 are symmetrically disposed with respect to the extension line QQ' of the first vertical portion 1511. This arrangement is conducive to achieving symmetry of the viewing angle.

Figure 4:
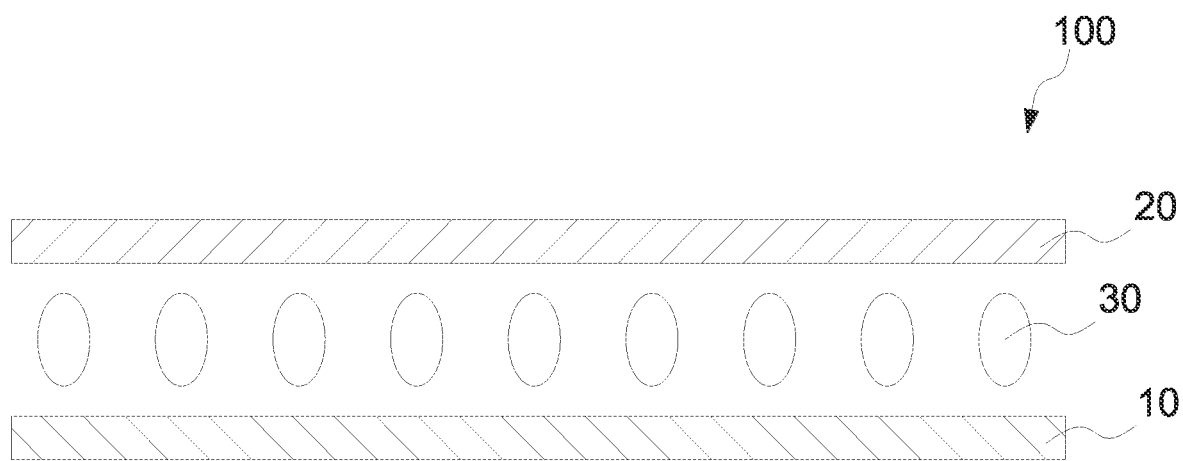
FIG. 4 is a schematic structural diagram of a liquid crystal display panel according to an embodiment of the present disclosure.

Correspondingly, please refer to FIG. 4, the present disclosure further provides a liquid crystal display panel 100 comprising a color filter substrate 20, a liquid crystal layer 30, and the array substrate 10 as described in the above embodiments.

A structure of the array substrate 10 of the liquid crystal display panel 100 of this embodiment is the same as a structure of the array substrate 10 of the above embodiments. For details, please refer to the description of the array substrate 10 of the above embodiments, which will not be repeated herein.

In the embodiments of the disclosure, the sub-pixel electrode(s) is/are disposed on one or two sides of the main pixel electrode. The main pixel electrode is configured for liquid crystal alignment within a narrow viewing angle, and the sub-pixel electrode is configured for liquid crystal alignment within a wide viewing angle. Specifically, when the display panel is in an anti-peeping state, the main pixel electrode is turned on, and the sub-pixel electrode is turned off. When the display panel is in a shared state, the main pixel electrode and the sub-pixel electrode are simultaneously turned on. The above arrangement simplifies an anti-peeping structure.

The array substrate and the liquid crystal display panel provided by the embodiments of the present disclosure are described in detail above. The present disclosure uses specific examples to describe principles and embodiments of the present invention. The above description of the embodiments is only for helping to understand the present invention. Furthermore, those skilled in the art may make modifications to the specific embodiments and applications according to ideas of the present invention. In conclusion, the present specification should not be construed as a limitation to the present invention.

What is claimed is:

1. An array substrate, comprising:
a plurality of first gate lines;
a plurality of second gate lines spaced apart from the first gate lines;
a plurality of data lines, wherein the data lines cross the first gate lines to form a plurality of pixel areas; and
a plurality of pixel electrodes,
wherein each of the pixel electrodes is disposed in a corresponding one of the pixel areas and comprises a main pixel electrode, a first sub-pixel electrode, and a second sub-pixel electrode,
the first sub-pixel electrode is disposed on a side of the main pixel electrode and is disposed independently of the main pixel electrode,
the second sub-pixel electrode is disposed on another side of the main pixel electrode and disposed independently of the main pixel electrode,
the main pixel electrode is electrically connected to a corresponding one of the first gate lines,
the first sub-pixel electrode is electrically connected to a corresponding one of the second gate lines,
the second sub-pixel electrode is electrically connected to the corresponding one of the second gate lines,
an alignment angle on liquid crystals by the first sub-pixel electrode is different from an alignment angle on the liquid crystals by the second sub-pixel electrode, and
an alignment angle on the liquid crystals by the main pixel electrode is less than an alignment angle on the liquid crystals by the first sub-pixel electrode.

2. The array substrate according to claim 1, wherein:
the main pixel electrode comprises:
a first vertical portion, wherein an extending direction of the first vertical portion is perpendicular to an extending direction of the first gate lines;
a first horizontal portion intersecting with the first vertical portion, wherein the first horizontal portion and the first vertical portion divide the main pixel electrode into at least a first region and a second region;
a plurality of first branch electrodes disposed in the first region and parallel to each other, wherein at least part of the first branch electrodes obliquely extends outward from the first vertical portion, and an included angle between an extending direction of the first branch electrodes and the extending direction of the first vertical portion is a first included angle; and
a plurality of second branch electrodes disposed in the second region, wherein a top view pattern of the second branch electrodes and a top view pattern of the first branch electrodes are symmetrically disposed with respect to an extension line of the first vertical portion; and
the first sub-pixel electrode comprises:
a second vertical portion, wherein an extending direction of the second vertical portion is perpendicular to the extending direction of the first gate lines; and
a plurality of first sub-electrodes, wherein at least part of the first sub-electrodes obliquely extends outward from the second vertical portion, an included angle between an extending direction of the first sub-electrodes and the extending direction of the second vertical portion is a second included angle, and the first included angle is less than the second included angle.

3. The array substrate according to claim 2, wherein the first sub-pixel electrode further comprises only one alignment region, and the first sub-electrodes are disposed in the alignment region.

4. The array substrate according to claim 3, wherein the first sub-pixel electrode further comprises:
another second vertical portion, wherein the two second vertical portions are disposed opposite to each other, and the first sub-electrodes are connected between the two second vertical portions; and
two second horizontal portions extending in a direction parallel to the first gate lines and disposed opposite to each other, wherein the second horizontal portions and the second vertical portions are connected end to end to form a frame.

5. The array substrate according to claim 2, wherein the first sub-pixel electrode further comprises a first alignment region and a second alignment region that are adjacently disposed and further comprises a plurality of second sub-electrodes, wherein the first sub-electrodes are disposed in the first alignment region, the second sub-electrodes are disposed in the second alignment region, at least part of the second sub-electrodes obliquely extends outward from the second vertical portion, and an extending direction of the second sub-electrodes is different from the extending direction of the first sub-electrodes.

6. The array substrate according to claim 5, wherein the first sub-pixel electrode further comprises a second horizontal portion extending in a direction parallel to the first gate lines and connected to the second vertical portion, wherein the second horizontal portion and the second vertical portion define the first alignment region and the second alignment region, and the included angle between the extending direction of the first sub-electrodes and the extending direction of the second vertical portion is equal to an included angle between the extending direction of the second sub-electrodes and the extending direction of the second vertical portion.

7. The array substrate according to claim 2, wherein the first included angle is greater than 0 degrees and less than or equal to 15 degrees, and the second included angle is greater than or equal to 75 degrees and less than 90 degrees.

8. The array substrate according to claim 1, wherein
a top view pattern of the first sub-pixel electrode and a top view pattern of the second sub-pixel electrode are symmetrically disposed with respect to an extension line of the first vertical portion.

9. The array substrate according to claim 2, wherein a part of the first branch electrodes is connected to the first horizontal portion, the other part of the first branch electrodes is connected to the first vertical portion, a part of the second branch electrodes is connected to the first horizontal portion, and the other part of the second branch electrodes is connected to the first vertical portion.

10. The array substrate according to claim 9, wherein the first horizontal portion and the first vertical portion further divide the main pixel electrode into a third region and a fourth region, the main pixel electrode further comprises:
a plurality of third branch electrodes disposed in the third region, wherein a top view pattern of the third branch electrodes and the top view pattern of the first branch electrodes are symmetrically disposed with respect to an extension line of the first horizontal portion; and
a plurality of fourth branch electrodes disposed in the fourth region, wherein a top view pattern of the fourth branch electrodes and the top view pattern of the second branch electrodes are symmetrically disposed with respect to the extension line of the first horizontal portion.

11. A liquid crystal display panel, comprising a color filter substrate, a liquid crystal layer, and an array substrate, wherein the array substrate comprises:
a plurality of first gate lines;
a plurality of second gate lines spaced apart from the first gate lines;
a plurality of data lines, wherein the data lines cross the first gate lines to form a plurality of pixel areas; and
a plurality of pixel electrodes,
wherein each of the pixel electrodes is disposed in a corresponding one of the pixel areas and comprises a main pixel electrode, a first sub-pixel electrode, and a second sub-pixel electrode,
the first sub-pixel electrode is disposed on a side of the main pixel electrode and is disposed independently of the main pixel electrode,
the second sub-pixel electrode is disposed on another side of the main pixel electrode and disposed independently of the main pixel electrode,
the main pixel electrode is electrically connected to a corresponding one of the first gate lines,
the first sub-pixel electrode is electrically connected to a corresponding one of the second gate lines,
the second sub-pixel electrode is electrically connected to the corresponding one of the second gate lines,
an alignment angle on liquid crystals by the first sub-pixel electrode is different from an alignment angle on the liquid crystals by the second sub-pixel electrode, and
an alignment angle on the liquid crystals by the main pixel electrode is less than an alignment angle on the liquid crystals by the first sub-pixel electrode.

12. The liquid crystal display panel according to claim 11, wherein:
the main pixel electrode comprises:
a first vertical portion, wherein an extending direction of the first vertical portion is perpendicular to an extending direction of the first gate lines;
a first horizontal portion intersecting with the first vertical portion, wherein the first horizontal portion and the first vertical portion divide the main pixel electrode into at least a first region and a second region;
a plurality of first branch electrodes disposed in the first region and parallel to each other, wherein at least part of the first branch electrodes obliquely extends outward from the first vertical portion, and an included angle between an extending direction of the first branch electrodes and the extending direction of the first vertical portion is a first included angle; and
a plurality of second branch electrodes disposed in the second region, wherein a top view pattern of the second branch electrodes and a top view pattern of the first branch electrodes are symmetrically disposed with respect to an extension line of the first vertical portion; and
the first sub-pixel electrode comprises:
a second vertical portion, wherein an extending direction of the second vertical portion is perpendicular to the extending direction of the first gate lines; and
a plurality of first sub-electrodes, wherein at least part of the first sub-electrodes obliquely extends outward from the second vertical portion, an included angle between an extending direction of the first sub-electrodes and the extending direction of the second vertical portion is a second included angle, and the first included angle is less than the second included angle.

13. The liquid crystal display panel according to claim 12, wherein the first sub-pixel electrode further comprises only one alignment region, and the first sub-electrodes are disposed in the alignment region.

14. The liquid crystal display panel according to claim 13, wherein the first sub-pixel electrode further comprises:
another second vertical portion, wherein the two second vertical portions are disposed opposite to each other, and the first sub-electrodes are connected between the two second vertical portions; and
two second horizontal portions extending in a direction parallel to the first gate lines and disposed opposite to each other, wherein the second horizontal portions and the second vertical portions are connected end to end to form a frame.

15. The liquid crystal display panel according to claim 12, wherein the first sub-pixel electrode further comprises a first alignment region and a second alignment region that are adjacently disposed and further comprises a plurality of second sub-electrodes, wherein the first sub-electrodes are disposed in the first alignment region, the second sub-electrodes are disposed in the second alignment region, at least part of the second sub-electrodes obliquely extends outward from the second vertical portion, and an extending direction of the second sub-electrodes is different from the extending direction of the first sub-electrodes.

16. The liquid crystal display panel according to claim 15, wherein the first sub-pixel electrode further comprises a second horizontal portion extending in a direction parallel to the first gate lines and connected to the second vertical portion, wherein the second horizontal portion and the second vertical portion define the first alignment region and the second alignment region, and the included angle between the extending direction of the first sub-electrodes and the extending direction of the second vertical portion is equal to an included angle between the extending direction of the second sub-electrodes and the extending direction of the second vertical portion.

17. The liquid crystal display panel according to claim 12, wherein the first included angle is greater than 0 degrees and less than or equal to 15 degrees, and the second included angle is greater than or equal to 75 degrees and less than 90 degrees.

18. The liquid crystal display panel according to claim 11, wherein
a top view pattern of the first sub-pixel electrode and a top view pattern of the second sub-pixel electrode are symmetrically disposed with respect to an extension line of the first vertical portion.

19. The liquid crystal display panel according to claim 12, wherein a part of the first branch electrodes is connected to the first horizontal portion, the other part of the first branch electrodes is connected to the first vertical portion, a part of the second branch electrodes is connected to the first horizontal portion, and the other part of the second branch electrodes is connected to the first vertical portion.

20. The liquid crystal display panel according to claim 19, wherein the first horizontal portion and the first vertical portion further divide the main pixel electrode into a third region and a fourth region, the main pixel electrode further comprises:
a plurality of third branch electrodes disposed in the third region, wherein a top view pattern of the third branch electrodes and the top view pattern of the first branch electrodes are symmetrically disposed with respect to an extension line of the first horizontal portion; and
a plurality of fourth branch electrodes disposed in the fourth region, wherein a top view pattern of the fourth branch electrodes and the top view pattern of the second branch electrodes are symmetrically disposed with respect to the extension line of the first horizontal portion.

* * * * *